US012316076B2

(12) United States Patent
Huang et al.

(10) Patent No.: US 12,316,076 B2
(45) Date of Patent: May 27, 2025

(54) VERTICAL CAVITY SURFACE EMITTING LASER DIODE (VCSEL) WITH TUNNEL JUNCTION

(71) Applicant: VISUAL PHOTONICS EPITAXY CO., LTD., Taoyuan (TW)

(72) Inventors: Chao-Hsing Huang, Taoyuan (TW); Yu-Chung Chin, Taoyuan (TW); Van-Truong Dai, Vinhphuc province (VN)

(73) Assignee: VISUAL PHOTONICS EPITAXY CO., LTD., Taoyuan (TW)

( * ) Notice: Subject to any disclaimer, the term of this patent is extended or adjusted under 35 U.S.C. 154(b) by 14 days.

(21) Appl. No.: 17/060,287

(22) Filed: Oct. 1, 2020

(65) Prior Publication Data

US 2021/0104872 A1   Apr. 8, 2021

(30) Foreign Application Priority Data

Oct. 4, 2019 (TW) .................. 108136121

(51) Int. Cl.
*H01S 5/30* (2006.01)
*H01S 5/02* (2006.01)
(Continued)

(52) U.S. Cl.
CPC .......... *H01S 5/3095* (2013.01); *H01S 5/0206* (2013.01); *H01S 5/18358* (2013.01); *H01S 5/3436* (2013.01); *H01S 5/34366* (2013.01)

(58) Field of Classification Search
CPC ....................... H01S 5/3095; H01S 5/18311
See application file for complete search history.

(56) References Cited

U.S. PATENT DOCUMENTS 6,181,723 B1 * 1/2001 Okubo .................. H01L 33/305
                                                  372/45.01
6,779,259 B2    8/2004 Mimura et al.
(Continued)

FOREIGN PATENT DOCUMENTS

CN          104577711          4/2015
CN          106981822          7/2017
(Continued)

OTHER PUBLICATIONS

Chinese Office Action for Chinese Patent Application No. 202011048141.2 dated Aug. 26, 2021.

*Primary Examiner* — Michael Carter
(74) *Attorney, Agent, or Firm* — Birch, Stewart, Kolasch & Birch, LLP

(57) ABSTRACT

Provided is a vertical cavity surface emitting laser diode (VCSEL). A tunnel junction with a high doping concentration is provided in the VCSEL. An n-type semiconductor layer of the tunnel junction has stress relative to the substrate, and is doped with at least one element such that the tunnel junction not only has a high doping concentration, but also the epitaxial layer can be oxidized and the oxidation rate is relatively stable during the oxidation process. Alternatively, the n-type semiconductor layer is doped with at least two elements. As a result, the oxidation process of the VCSEL can be stably performed, and the resistance of the tunnel junction with a high doping concentration is low. The tunnel junction is suitable to be arranged between two active layers of the VCSEL or between the p-type semiconductor and the n-type semiconductor layer of the VCSEL.

7 Claims, 12 Drawing Sheets

(51) Int. Cl.
  *H01S 5/183*  (2006.01)
  *H01S 5/343*  (2006.01)

(56) References Cited

U.S. PATENT DOCUMENTS

| | | | |
|---|---|---|---|
| 6,810,065 B1* | 10/2004 | Naone | H01S 5/18311 |
| | | | 372/45.01 |
| 6,822,995 B2 | 11/2004 | Kwon | |
| 7,501,294 B1* | 3/2009 | Nakagawa | H01S 5/18311 |
| | | | 438/22 |
| 10,707,650 B2* | 7/2020 | Ghosh | H01S 5/3095 |
| 11,152,767 B1* | 10/2021 | Aboujja | H01S 5/3434 |
| 2001/0050934 A1* | 12/2001 | Choquette | H01S 5/1833 |
| | | | 372/50.11 |
| 2004/0076209 A1* | 4/2004 | Bour | H01S 5/18366 |
| | | | 372/45.01 |
| 2005/0063440 A1 | 3/2005 | Deppe | |
| 2007/0013996 A1* | 1/2007 | Verma | H01S 5/50 |
| | | | 359/344 |
| 2007/0254393 A1 | 11/2007 | Johnson | |
| 2015/0255955 A1 | 9/2015 | Wang et al. | |
| 2019/0067909 A1 | 2/2019 | Ghosh et al. | |
| 2019/0252857 A1 | 8/2019 | Qiao et al. | |
| 2019/0280143 A1 | 9/2019 | Ding et al. | |

FOREIGN PATENT DOCUMENTS

| | | |
|---|---|---|
| CN | 107527967 | * 12/2017 |
| CN | 109075532 | 12/2018 |
| TW | 200644366 | 12/2006 |
| TW | I271906 | 1/2007 |
| TW | I293806 | 2/2008 |

* cited by examiner

VERTICAL CAVITY SURFACE EMITTING LASER DIODE (VCSEL) WITH TUNNEL JUNCTION

CROSS-REFERENCE TO RELATED APPLICATION

This application claims priority to Taiwanese Application Serial No. 108136121, filed on Oct. 4, 2019. The entirety of the above-mentioned patent application is hereby incorporated by reference herein.

TECHNICAL FIELD

The technical field relates to a vertical cavity surface emitting layer diode (VCSEL), especially a VCSEL with a tunnel junction.

BACKGROUND

A tunnel junction is generally composed of a p-type semiconductor layer and an n-type semiconductor layer. In principle, given the situation that the doping concentrations of the p-type semiconductor layer and the n-type semiconductor layer are sufficiently high, the carrier tunneling probability of the tunnel junction will be higher, and the resistance of the tunnel junction will be lower. A commonly used material for the tunnel junction is GaAs. The p-type GaAs layer is usually doped with carbon (C) to realize high doping concentration, and the n-type GaAs layer is normally doped with tellurium (Te) or selenium (Se) to realize high doping concentration.

In addition, when the doping concentration of the ohmic contact layer is higher and the bandgap is smaller, the ohmic contact layer better form an ohmic contact with the metal material. One of the commonly used materials for the ohmic contact layer is n-type GaAs. Consequently, the ohmic contact layer can also increase its doping concentration by doping Te or Se in the n-type GaAs.

Under the condition that the material and content of aluminum of the oxidation layer and oxidation process conditions are unchanged, compared with the n-type GaAs layer that is not doped with Te or Se, the doping concentration of the n-type GaAs layer doped with Te or Se is significantly higher, but actually affect the VCSEL oxidation process. Specifically, the oxidation rate of the oxidation layer will slow down, or it may be difficult to perform a stable oxidation process or the oxidation process becomes difficult to control due to the unstable oxidation rate. Although the oxidation rate of the oxidation layer can be increased by increasing the content of aluminum of the oxidation layer, high content of aluminum of the oxidation layer may cause the reliability of the VCSEL to decrease.

If the doping concentration of Te or Se of the GaAs layer becomes higher, even though the content of aluminum of the oxidation layer is further increased, the oxidation layer may be more difficult to be oxidized.

SUMMARY

In order to solve the shortcomings of the prior art, a first tunnel junction or a second tunnel junction with high doping concentration and low resistance is provided in a VCSEL. When the VCSEL undergoes an oxidation process, an oxidation layer of the VCSEL can be smoothly oxidized.

In one embodiment of the present disclosure, a VCSEL includes a GaAs substrate and an epitaxial structure. The epitaxial structure is formed on the GaAs substrate. The epitaxial structure includes at least one oxidation layer and a first tunnel junction. The first tunnel junction includes a first n-type semiconductor layer. The first n-type semiconductor layer is disposed above or below the at least one oxidation layer. The first n-type semiconductor layer doped with tellurium and/or selenium is not lattice-matched to the GaAs.

In one embodiment of the present disclosure, a VCSEL includes a GaAs substrate and an epitaxial structure. The epitaxial structure is formed on the GaAs substrate. The epitaxial structure includes at least one oxidation layer and a second tunnel junction. The second tunnel junction includes a second n-type semiconductor layer. The second tunnel junction is disposed above or below the at least one oxidation layer. The second n-type semiconductor layer includes an n-type GaAs layer. The n-type GaAs layer is doped with at least one material selected from the group consisting tellurium and selenium and doped with at least one material selected from the group consisting of silicon and carbon.

On the other hand, the aforementioned first n-type semiconductor layer and second n-type semiconductor layer can also be used as ohmic contact layers alone. In one embodiment of the present disclosure, a VCSEL includes a GaAs substrate and an epitaxial structure. The epitaxial structure is formed on the GaAs substrate. The epitaxial structure includes at least one oxidation layer and an ohmic contact layer. The ohmic contact layer is located above or below the at least one oxidation layer. The ohmic contact layer includes a first n-type semiconductor layer or a second n-type semiconductor layer. The first n-type semiconductor layer doped with tellurium and/or selenium is not lattice-matched to the GaAs substrate. The second n-type semiconductor layer comprises an n-type GaAs layer, and the n-type GaAs layer is doped with at least one material selected from the group consisting of tellurium and selenium and doped with at least one material selected from the group consisting of silicon and carbon.

DESCRIPTION OF THE EMBODIMENTS

Figure 1:
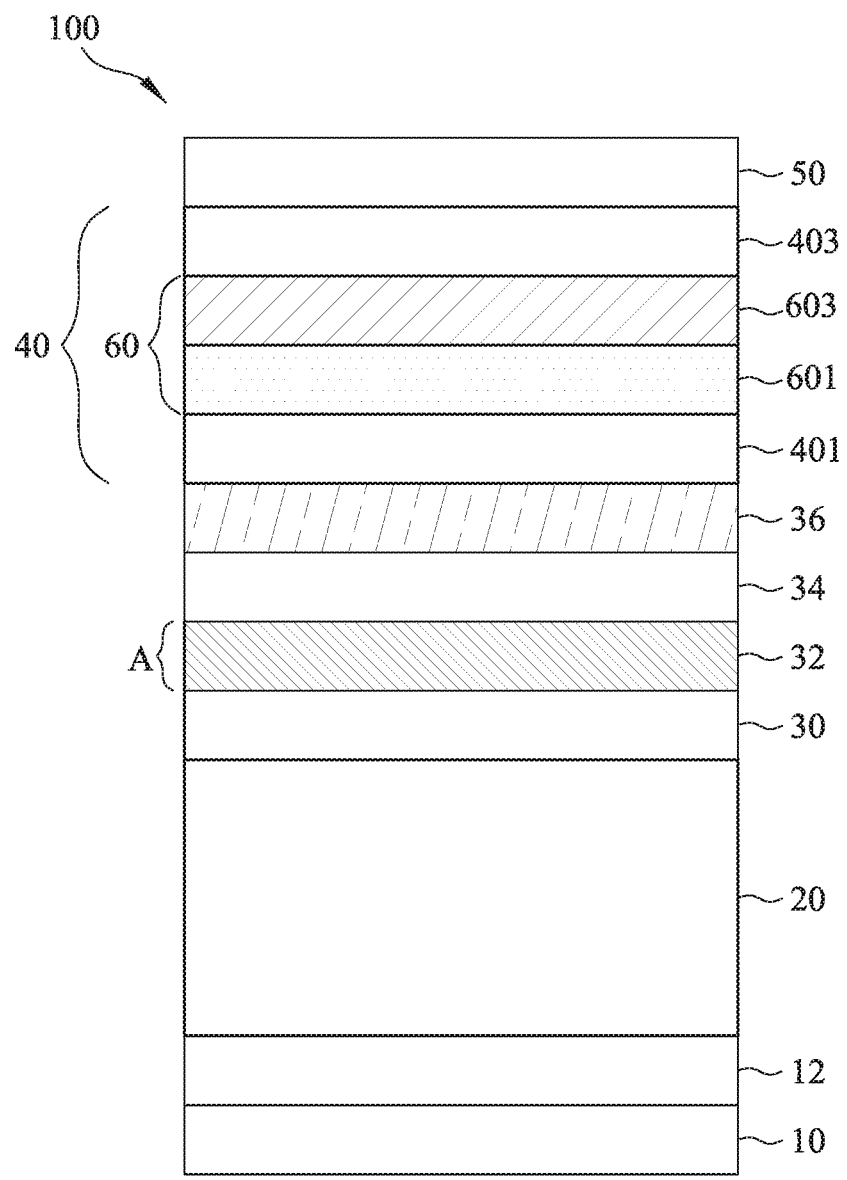
FIG. 1 is a schematic diagram of a first tunnel junction disposed on an upper DBR layer according to one embodiment of the present disclosure.

The embodiment of the present disclosure is described in detail below with reference to the drawings and element symbols, such that persons skilled in the art is able to implement the present application after understanding the specification of the present disclosure.

Specific examples of components and arrangements are described below to simplify the present disclosure. These are, of course, merely examples and they are not intended to limit the scope of the present disclosure. In the present disclosure, for example, when a layer formed above or on another layer, it may include an exemplary embodiment in which the layer is in direct contact with the another layer, or it may include an exemplary embodiment in which other devices or epitaxial layers are formed between thereof, such that the layer is not in direct contact with the another layer. In addition, repeated reference numerals and/or notations may be used in different embodiments, these repetitions are only used to describe some embodiments simply and clearly, and do not represent a specific relationship between the different embodiments and/or structures discussed.

Further, spatially relative terms, such as "underlying," "below," "lower," "overlying," "above," "upper" and the like, may be used herein for ease of description to describe one device or feature's relationship to another device(s) or feature(s) as illustrated in the figures and/or drawings. The spatially relative terms are intended to encompass different orientations of the device in use or operation in addition to the orientation depicted in the figures and/or drawings.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of the present disclosure are not necessarily all referring to the same embodiment.

Furthermore, the particular features, structures or characteristics may be combined in any suitable manner in one or more embodiments of the present disclosure. Further, for the terms "including", "having", "with", "wherein" or the foregoing transformations used herein, these terms are similar to the term "comprising" to include corresponding features.

In addition, a "layer" may be a single layer or a plurality of layers; and "a portion" of an epitaxial layer may be one layer of the epitaxial layer or a plurality of adjacent layers.

In the prior art, the laser diode can be optionally provided with a buffer layer according to actual needs, and in some embodiments, the materials of the buffer and the substrate may be the same. Whether the buffer is provided is not substantially related to the technical characteristics to be described in the following embodiments and the effects to be provided. Accordingly, for the sake of a brief explanation, the following embodiments are only described with a laser diode having a buffer layer, and no further description is given to a laser without a buffer layer; that is, the following embodiments can also be applied by replacing a laser diode without a buffer.

The vertical cavity surface emitting laser diode (VCSEL) in the following embodiments is fabricated by epitaxially growing a multi-layer epitaxial structure on the GaAs substrate 10 by means of metalorganic chemical vapor deposition (MOCVD). However, the epitaxial growth method is not limited to MOCVD. Molecular-beam epitaxy (MBE) or other epitaxial growth methods can also be used to form a multi-layer epitaxial structure.

Embodiment 1-1

Referring to FIG. 1, an n-type buffer layer 12, an n-type lower DBR layer 20, a first n-type lower spacer layer 30, an active layer 32, a first p-type upper spacer layer 34, a p-type oxidation layer 36 (to be oxidized), a p-type upper DBR layer 401 and a first p-type semiconductor layer 601 are sequentially epitaxially grown on an n-type GaAs substrate 10; subsequently, a first n-type semiconductor layer 603, an n-type upper DBR layer 403 and an n-type ohmic contact layer 50 are sequentially formed on the first p-type semiconductor layer 601 such that the structure of the VCSEL 100 is formed. After the VCSEL 100 is subjected to an oxidation process, the oxidation layer 36 will form optical aperture (OA), which is not shown.

The first p-type semiconductor layer 601 and the first n-type semiconductor layer 603 constitute a first tunnel junction 60. As shown in FIG. 1, the first tunnel junction 60 is included in an upper DBR layer 40.

Embodiment 1-2

If a second p-type semiconductor layer, a second n-type semiconductor layer, the n-type upper DBR layer 403 and the n-type ohmic contact layer 50 are sequentially epitaxially grown on the p-type upper DBR layer 401 in FIG. 1, a second tunnel junction (not shown) is included in the upper DBR layer 40. The aforementioned second p-type semiconductor layer and second n-type semiconductor layer constitute the second tunnel junction.

For the convenience of the following description, the epitaxial region between the substrate and the active region is called the lower epitaxial region. The lower epitaxial region must be provided with the lower DBR layer 20. In addition, the lower epitaxial region further includes the buffer layer 12 and the first lower spacer layer 30, but not limited thereto. According to the purpose or performance of the VCSEL, the lower epitaxial region may further include at least one oxidation layer and other appropriate epitaxial layers. The epitaxial region above the active region is referred to as the upper epitaxial region.

Embodiment 2-1

Figure 2:
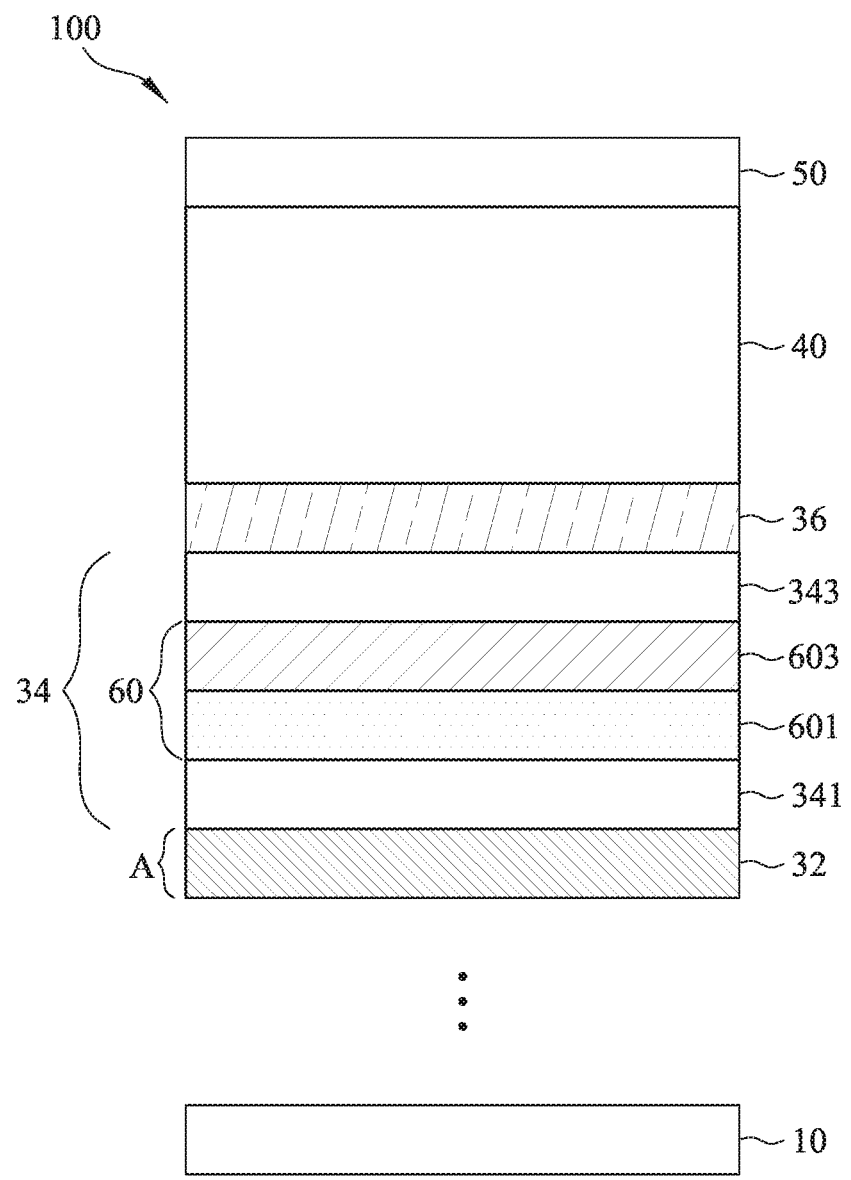
FIG. 2 is a schematic diagram of a first tunnel junction disposed on a first upper spacer layer according to one embodiment of the present disclosure.

Referring to FIG. 2, an n-type lower epitaxial region (not shown, see FIG. 1), an active layer 32, a first p-type upper spacer layer 341 and a first p-type semiconductor layer 601 are sequentially epitaxially grown on the GaAs substrate 10; subsequently, a first n-type semiconductor layer 603, a first n-type upper spacer layer 343, an n-type oxidation layer 36, an n-type upper DBR layer 40 and an n-type ohmic contact layer 50 are sequentially formed on the first p-type semiconductor layer 601 such that the fabrication of the VCSEL 100 is initially completed. After the VCSEL 100 of FIG. 2 undergoes an oxidation process, the oxidation layer 36 forms current confinement OA(s). The current confinement OA(s) are not shown. The aforesaid first p-type semiconductor layer 601 and first n-type semiconductor layer 603 constitute the first tunnel junction 60. As shown in FIG. 2, the first spacer layer 34 includes the first tunnel junction 60.

Embodiment 2-2

If a second p-type semiconductor layer (not shown), a second n-type semiconductor layer (not shown), the first n-type spacer layer 343, the n-type oxidation layer 36, the n-type DBR layer 40 and the n-type ohmic contact layer 50 are sequentially epitaxially grown on the first p-type upper spacer layer 341, a second tunnel junction (not shown) is included in the first spacer layer 34. The aforementioned second p-type semiconductor layer and second n-type semiconductor layer constitute the second tunnel junction.

Embodiment 3-1

Figure 3:
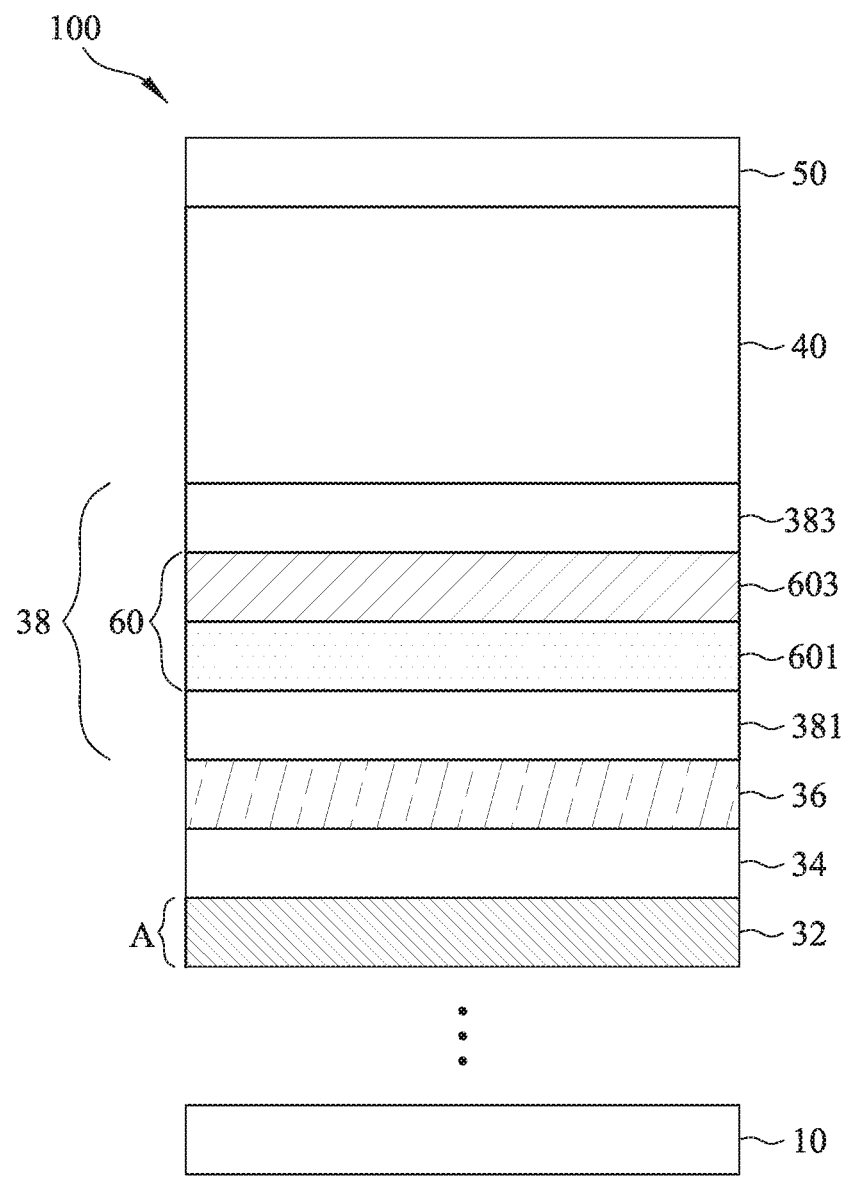
FIG. 3 is a schematic diagram of a first tunnel junction disposed on a second upper spacer layer according to one embodiment of the present disclosure.

Referring to FIG. 3, an n-type lower epitaxial region (not shown, see FIG. 1), an active layer 32, a first p-type lower spacer layer 34, a p-type oxidation layer 36, a second p-type upper spacer layer 381, a first p-type semiconductor layer 601 are sequentially epitaxially grown on the GaAs substrate 10; subsequently, a first n-type semiconductor layer 603, a second n-type upper spacer layer 383, an n-type upper DBR layer 40 and an n-type ohmic contact layer 50 are sequentially epitaxially grown on the first p-type semiconductor layer 601. Accordingly, the first tunnel junction 60 is disposed in the second spacer layer 38. The aforesaid first p-type semiconductor layer 601 and first n-type semiconductor layer 603 constitute the first tunnel junction 60.

Embodiment 3-2

If a second p-type semiconductor layer, a second n-type semiconductor layer, a second n-type upper spacer layer 383, an n-type DBR layer 40 and an n-type ohmic contact layer 50 are sequentially epitaxially grown on the second p-type upper spacer layer 381, the second tunnel junction is included in the second spacer layer 38. In other words, the first tunnel junction 60 of FIG. 3 is replaced with the second tunnel junction.

The aforementioned first tunnel junction or second tunnel junction can also be formed in the lower epitaxial region Embodiment 4-1

Figure 4:
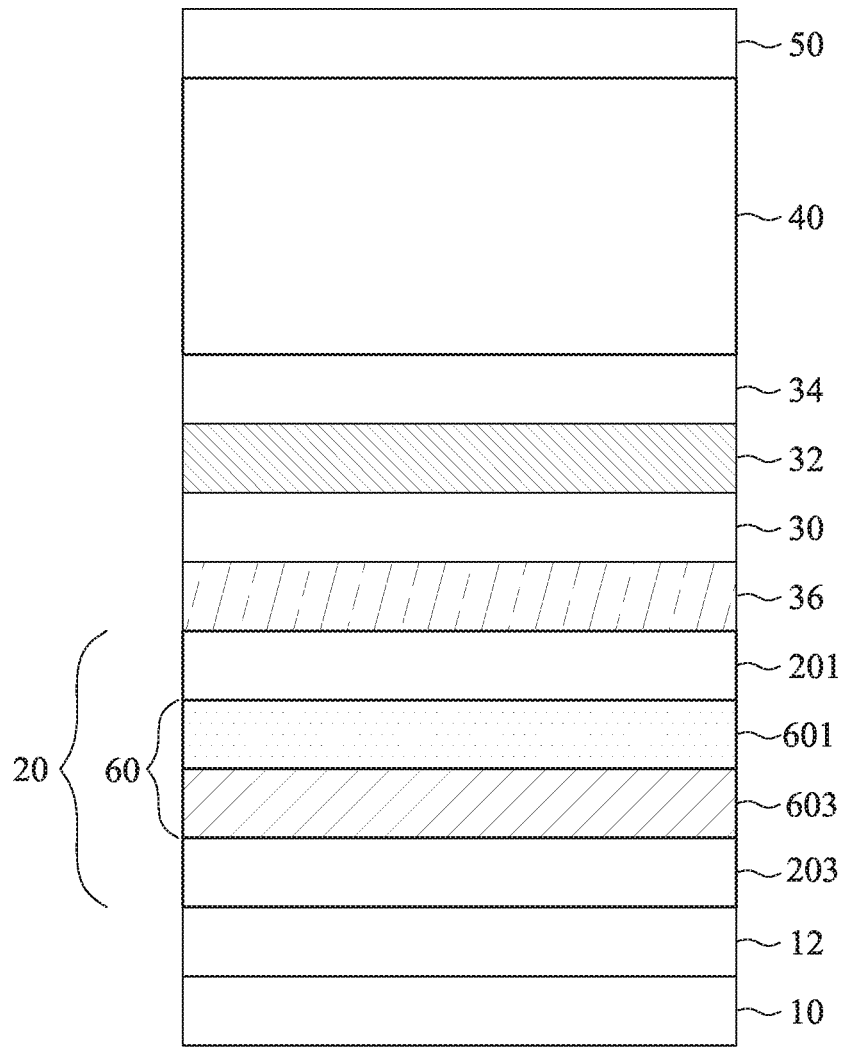
FIG. 4 is a schematic diagram of a first tunnel junction disposed on a lower DBR layer according to one embodiment of the present disclosure.

As shown in FIG. 4, an n-type buffer layer 12, an n-type lower DBR layer 203 and a first n-type semiconductor layer 603 are sequentially formed on the GaAs substrate 10; subsequently, a first p-type semiconductor layer 601, a p-type lower DBR layer 201, a p-type oxidation layer 36 and a first p-type lower spacer layer 30 are sequentially formed on the first n-type semiconductor layer 603. An active layer 32 and an n-type upper epitaxial region are formed on the first p-type lower spacer layer 30. As a result, the first tunnel junction 60 can be formed in the lower DBR layer 20.

Embodiment 4-2

If a second n-type semiconductor layer, a second p-type semiconductor layer, a p-type lower DBR layer 201, a p-type oxidation layer 36 and a first p-type lower spacer layer 30 are sequentially epitaxially grown on the n-type lower DBR layer 203, the second tunnel junction can be included in the lower DBR layer 20. In other words, the first tunnel junction 60 of FIG. 4 is replaced with the second tunnel junction.

Figure 5:
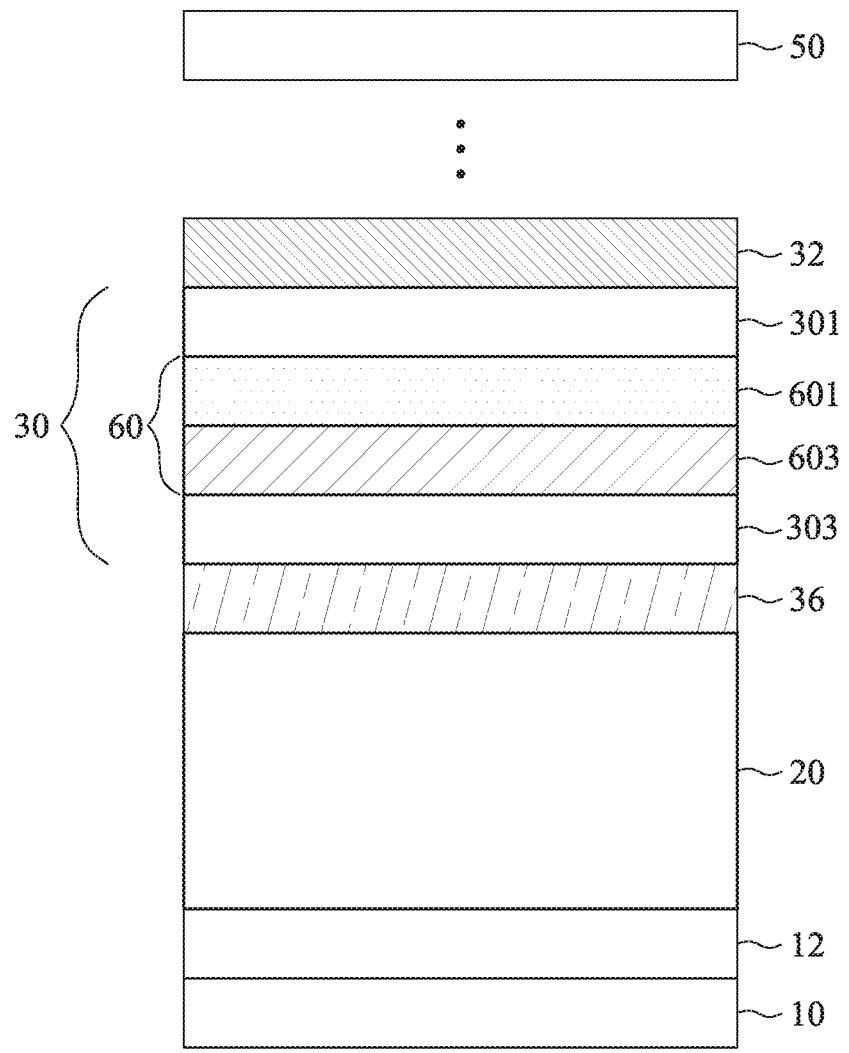
FIG. 5 is a schematic diagram of a first tunnel junction disposed on a first lower spacer layer according to one embodiment of the present disclosure.
Figure 6:
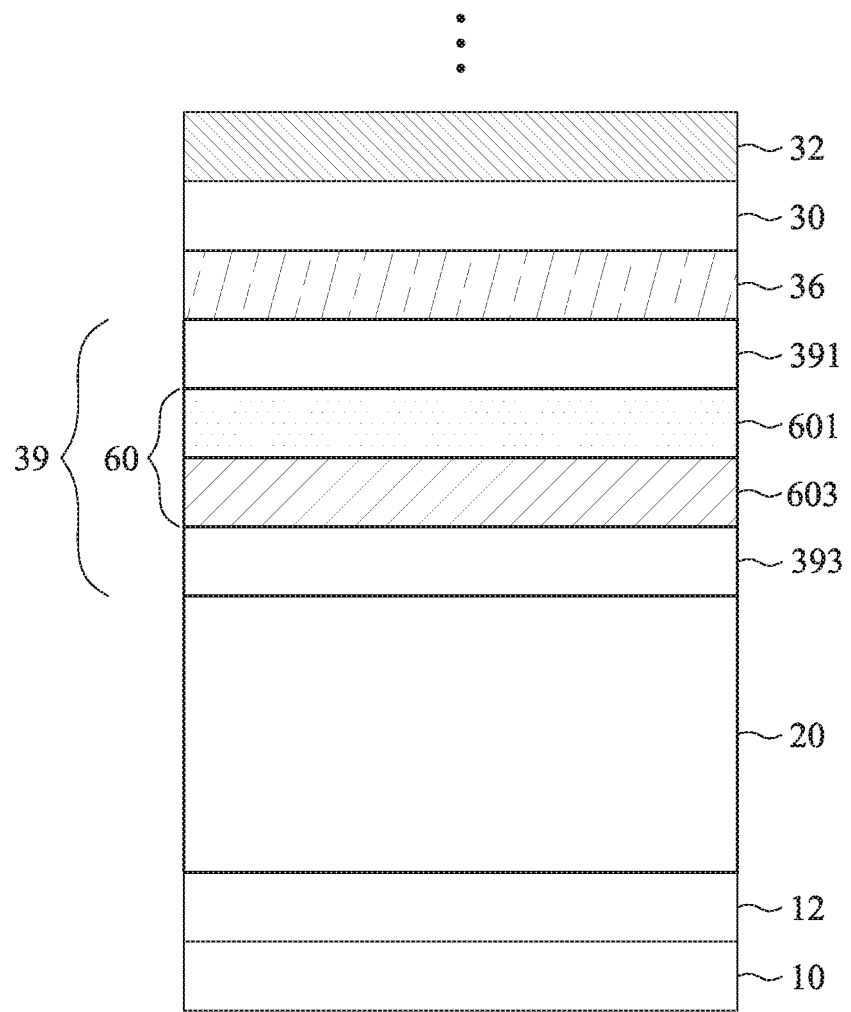
FIG. 6 is a schematic diagram of a first tunnel junction disposed on a second lower spacer layer according to one embodiment of the present disclosure.

FIGS. 5 and 6 show that the first (second) tunnel junction is disposed in the first lower spacer layer 30 and the second lower spacer layer 39 in the lower epitaxial region. Please refer to the previous embodiments for the fabricating method of the first (second) tunnel junction, which will not be repeated herein.

The above-mentioned first n-type semiconductor layer is doped with Te and/or Se, and "has stress relative to the GaAs substrate." Compared with the n-type semiconductor layer of the conventional tunnel junction (under the same oxidation process conditions and the same material and composition of the oxidation layer), the first n-type semiconductor layer not only has a higher doping concentration, but also the oxidation layer can be oxidized smoothly; that is, the oxidation rate of the oxidation layer is faster or more stable, or the oxidation process is easier to control.

In one embodiment, the first n-type semiconductor layer doped with Te and/or Se is further doped with silicon (Si) and/or carbon (C).

The aforementioned "has stress relative to the GaAs substrate" means that the lattice constant of the material of the first n-type semiconductor layer is different from the lattice constant of the GaAs substrate. The preferred material of the first n-type semiconductor that "has stress relative to the GaAs substrate" includes at least one material selected from the group consisting of InGaAs, InGaP, GaAsP, GaAsSb, GaAsPSb, AlGaAs, AlGaAsSb, AlGaAsP, InAlGaAs, InAlGaP, InGaAsSb, InGaAsP, and GaPSb. The lattice constants of InGaP and InAlGaP are greater than the lattice constant of the GaAs substrate.

The aforementioned second n-type semiconductor layer includes an n-type GaAs layer. The n-type GaAs layer is doped with at least one material selected from the group consisting of Te and Se and doped with at least one material selected from the group consisting of Si and C. Compared with the n-type GaAs layer of the conventional tunnel junction, under the same oxidation process conditions and the same material and composition of the oxidation layer, the oxidation layer of the VCSEL with the second tunnel junction can be oxidized smoothly and stably. In other words, the oxidation rate of the oxidation layer is faster or the oxidation rate is relative stable, or the oxidation process can be easily controlled.

The above-mentioned first p-type semiconductor layer or second p-type semiconductor layer is doped with carbon. The carbon doping concentration is greater than $1 \times 10^{19}/cm^3$. For example, the carbon doping concentration may be $1 \times 10^{19}/cm^3$ or more, $3 \times 10^{19}/cm^3$ or more, $5 \times 10^{19}/cm^3$ or more, $8 \times 10^{19}/cm^3$ or more, $1 \times 10^{20}/cm^3$ or more, $1.3 \times 10^{20}/$ cm$^3$ or more, 1.6×10$^{20}$/cm$^3$ or more, 2.0×10$^{20}$/cm$^3$ or more, 2.5×10$^{20}$/cm$^3$ or more, or 3.0×10$^{20}$/cm$^3$ or more.

The aforementioned carbon doping concentration is measured by Secondary Ion Mass Spectrometry (SIMS).

The above-mentioned first p-type semiconductor layer or second p-type semiconductor layer includes at least one material selected from the group consisting of GaAs, InGaAs, GaAsP, GaAsPSb, GaAsSb, AlGaAs, AlGaAsSb, AlGaAsP, InAlGaAs, InAlGaP, InGaAsSb, GaPSb and InGaAsP.

In some embodiments, when only one oxidation layer is provided in the VCSEL and the oxidation layer is provided in the upper epitaxial region, the first (second) tunnel junction can be provided in the upper epitaxial region, the active region or the lower epitaxial region.

In some embodiments, when only one oxidation layer is provided in the VCSEL and the oxidation layer is provided in the lower epitaxial region, the first (second) tunnel junction can be provided in the lower epitaxial region, the active or the upper epitaxial region.

The position of the oxidation layer in the upper epitaxial region or the lower epitaxial region is not limited to the above embodiments. According to the structures of different VCSELs, the formation position and number of oxidation layers can be changed appropriately.

In the above embodiments in which the first (second) tunnel junction is disposed in the first upper (lower) spacer layer or the second upper (lower) spacer layer are only used to illustrate that the the first (second) tunnel junction can be disposed in an epitaxial layer other than the upper DBR layer, but do not mean that the first upper (lower) spacer layer and/or the second (lower) upper spacer layer must be provided in the upper (lower) epitaxial region. Depending on the purpose or performance of the VCSEL, the upper epitaxial region or the lower epitaxial region may not be necessarily provided with a spacer layer. Alternatively, the upper (lower) epitaxial region may be provided with other epitaxial layers in addition to the spacer layer. As such, the position and number of the first (second) tunnel junction can be appropriately changed according to various structures of the VCSELs.

The first tunnel junction or the second tunnel junction of the above-mentioned embodiment can also be separately or further disposed in the active region A including multiple active layers, and the preferred material and the doping material of the first tunnel junction or the second tunnel junction and other conditions mentioned above are the same as those in the foregoing embodiments.

Embodiment 5-1

Figure 7:
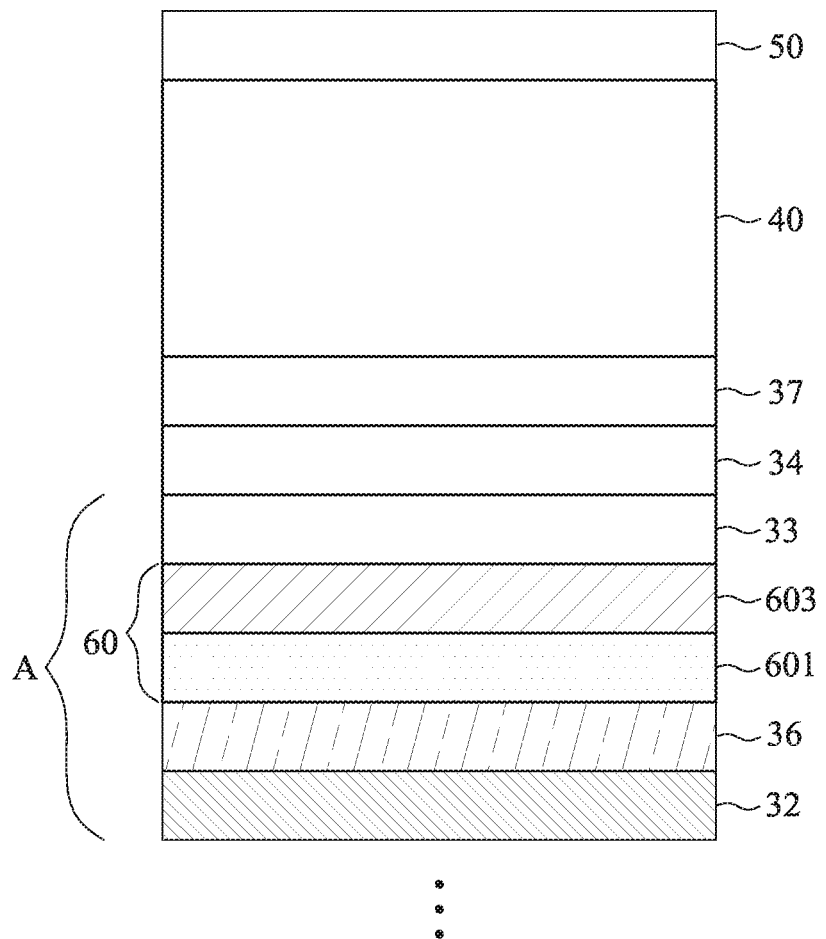
FIG. 7 is a schematic diagram of a first tunnel junction disposed between two active layers according to one embodiment of the present disclosure, wherein the active region and the upper epitaxial region have oxidation layers, respectively.

Referring to FIG. 7, the active layer 32 is epitaxially grown on the lower epitaxial region (not shown). The oxidation layer 36 is formed on the active layer 32; subsequently, the first p-type semiconductor layer 601 and first n-type semiconductor layer 603 are sequentially formed on the oxidation layer 36; and the active layer and the upper epitaxial region are sequentially formed on the first n-type semiconductor layer 603. The upper epitaxial region includes the upper spacer layer 34, the oxidation layer 37, the upper DBR layer 40 and the ohmic contact layer 50. Hence, the first tunnel junction 60 is provided in the active region A.

Embodiment 5-2

If a second p-type semiconductor layer and a second n-type semiconductor layer (or a second n-type semiconductor layer and a second p-type semiconductor layer) are sequentially formed on the oxidation layer 36 in FIG. 7, the active region 33 and the upper epitaxial region are sequentially formed on the second p-type semiconductor layer (second n-type semiconductor layer) such that the second tunnel junction is disposed in the active region.

Embodiment 6

The number of active layer can also be three or more than four. It is not necessary for every two adjacent active layers to be connected in series through the first tunnel junction and/or the second tunnel junction. For example, when there are three active layers, the three active layers can be connected in series by the first tunnel junction (or the second tunnel junction) and the conventional tunnel junction or other combinations. In this case, the upper epitaxial or the lower epitaxial region can also be provided with the existing tunnel junction. An active layer may include one or more quantum well layers.

The first (second) tunnel junction with high doping concentration has a low resistance when the appropriate material is selected. Therefore, by connecting two or more active layers in series through the first (second) tunnel junction, the power loss in the active region can be reduced, and the output power or performance of the VCSEL are thus improved. A spacer layer and/or an oxidation layer may also be included between two active layers, but not limited thereto. In some embodiments, the first tunnel junction or the second tunnel junction may be disposed in the spacer layer of the active region.

Embodiment 7

When the VCSEL includes multiple oxidation layers, the number of the first (second) tunnel junction can be one or more. For example, when the lower epitaxial region, the active region with multiple active layers, and the upper epitaxial region each include at least one oxidation layer, the number of the first (second) tunnel junction may be only one to facilitate the oxidation process. For example, the first (second) tunnel junction is arranged between the active region and the upper (lower) epitaxial region. According to the different epitaxial structures of the VCSELs, the number and way of forming the first (second) tunnel junction can be further adjusted accordingly.

Embodiment 8-1

When the first n-type semiconductor layer 603 of the above embodiment is formed on the upper DBR layer 40 of FIG. 1, since the first n-type semiconductor layer 603 has advantages such as high doping concentration, small bandgap and low resistance, the first n-type semiconductor layer can form a good ohmic contact with metal materials. Therefore, the first n-type semiconductor layer can be used as an ohmic contact layer.

Embodiment 8-2

When the second n-type semiconductor layer of the above embodiment is formed on the upper DBR layer 40 of FIG. 1, the second n-type semiconductor layer with high doping concentration, small bandgap and lower resistance can easily form a good ohmic contact with metal materials. Therefore, the second n-type semiconductor can be used as an ohmic contact layer.

Embodiment 8-3

Figure 8:
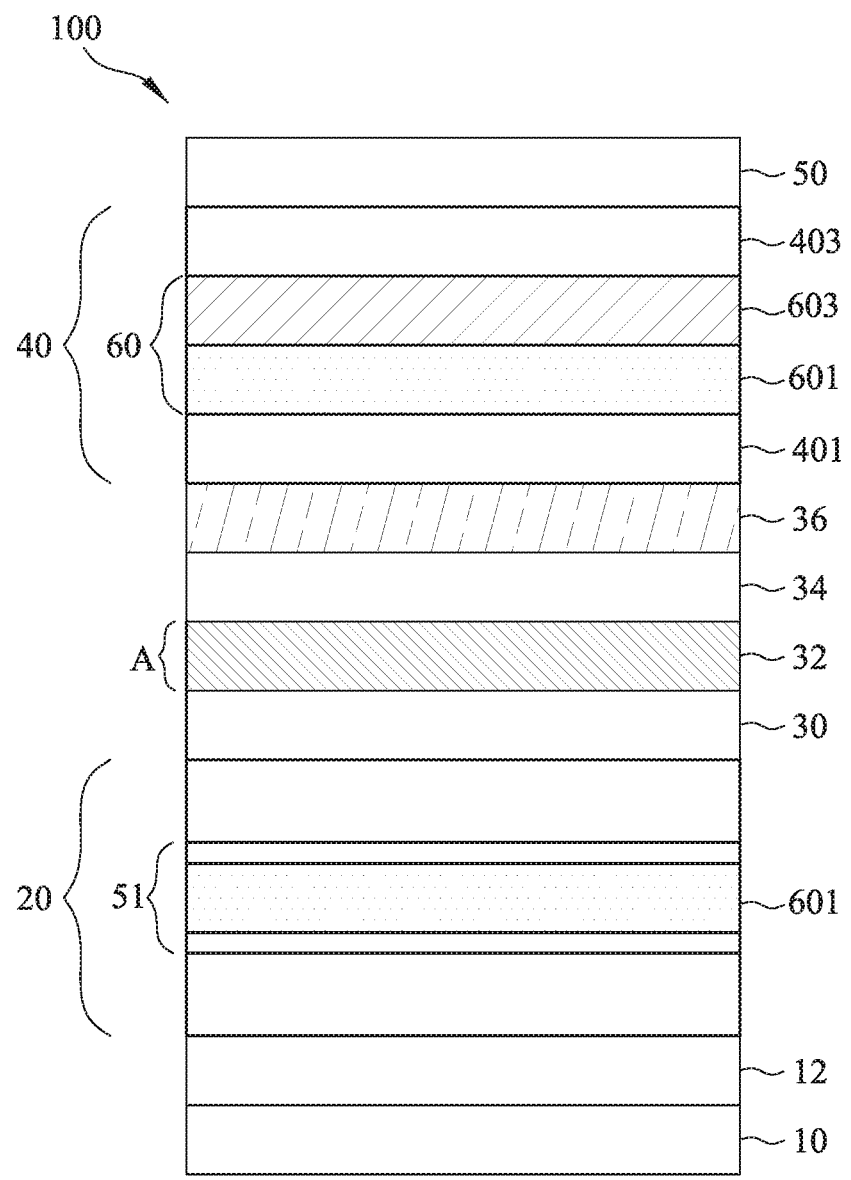
FIG. 8 is a schematic diagram of a first n-type semiconductor layer disposed on a lower DBR layer as an ohmic contact layer according to one embodiment of the present disclosure.

Referring to FIG. 8, the VCSEL 100 may be a top-emitting VCSEL or a bottom-emitting VCSEL. As shown in FIG. 8, the VCSEL 100 includes two ohmic contact layers 50 and 51. The ohmic contact layer 51 is formed in the n-type lower DBR layer 20, and may also include the first n-type semiconductor layer 601.

Embodiment 8-4

Figure 9:
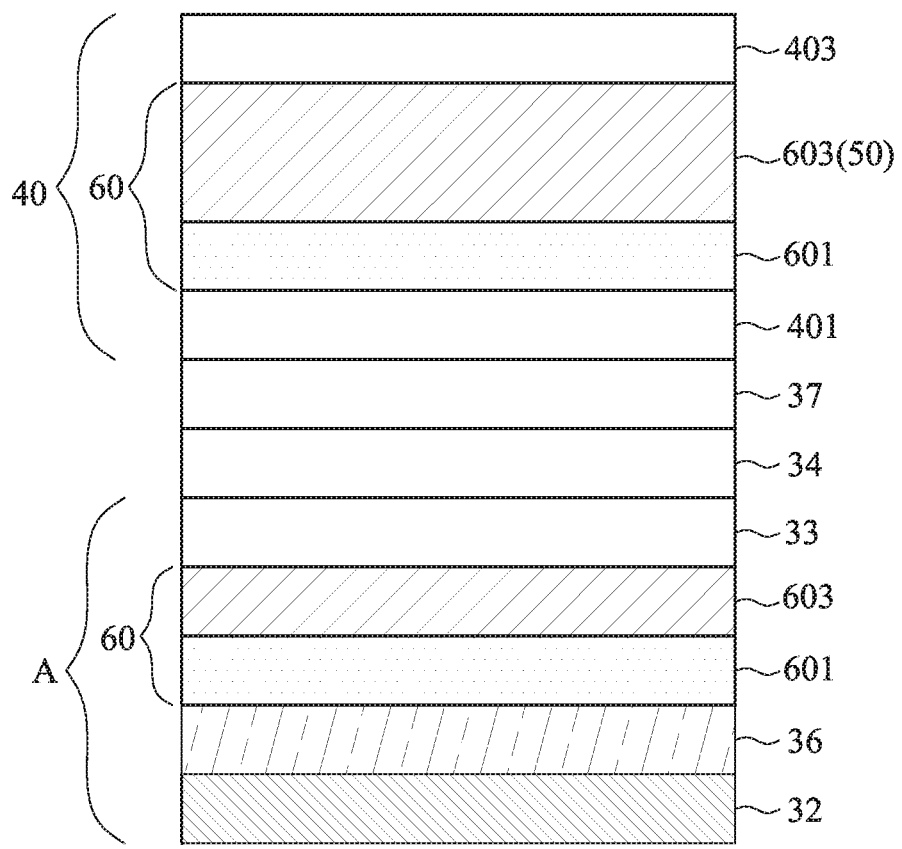
FIG. 9 is a schematic diagram of a first n-type semiconductor layer disposed on an upper DBR layer as an ohmic contact layer according to one embodiment of the present disclosure.

As shown in FIG. 9, the first n-type semiconductor layer 603 in the upper DBR layer 40 is not only a portion of the first tunnel junction 60, but also can be used as an ohmic contact layer.

Embodiment 9

Figure 10:
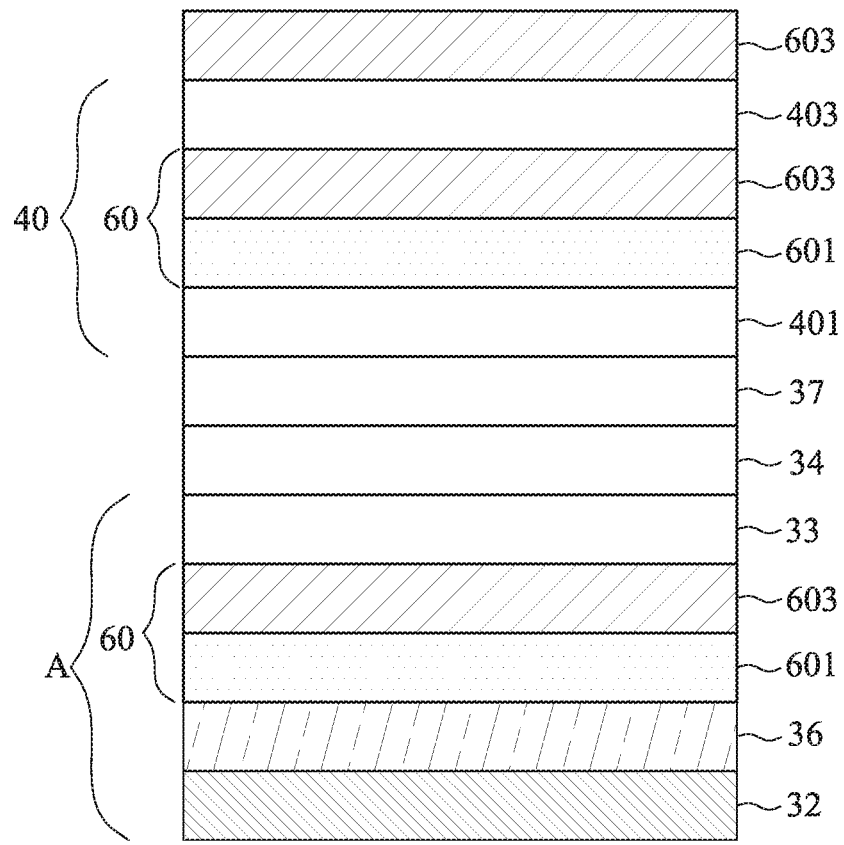
FIG. 10 is a schematic diagram of a VCSEL having two first tunnel junctions and a first semiconductor layer according to one embodiment of the present disclosure.

As shown in FIG. 10, the VCSEL includes two first tunnel junctions 60 and a first n-type semiconductor 603. The first n-type semiconductor layer 603 on the upper DBR layer 40 can be used as an ohmic contact layer. The two first tunnel junctions 60 are respectively disposed in the active region A and the upper DBR layer 40. Alternatively, the two first tunnel junctions 60 may be replaced with two second tunnel junctions, or may also be replaced with a first tunnel junction 60 and a second tunnel junction.

The first n-type semiconductor layer used as the ohmic contact layer includes at least one material selected from the group consisting of InGaAs, GaAsSb, GaAsPSb, AlGaAs, AlGaAsSb, AlGaAsP, InAlGaAs, InGaAsSb, InGaAsP, and GaPSb. In principle, when the bandgap of the first n-type semiconductor layer used as the ohmic contact layer is smaller, the first n-type semiconductor is easier to form an ohmic contact with the metal material.

Figure 11:
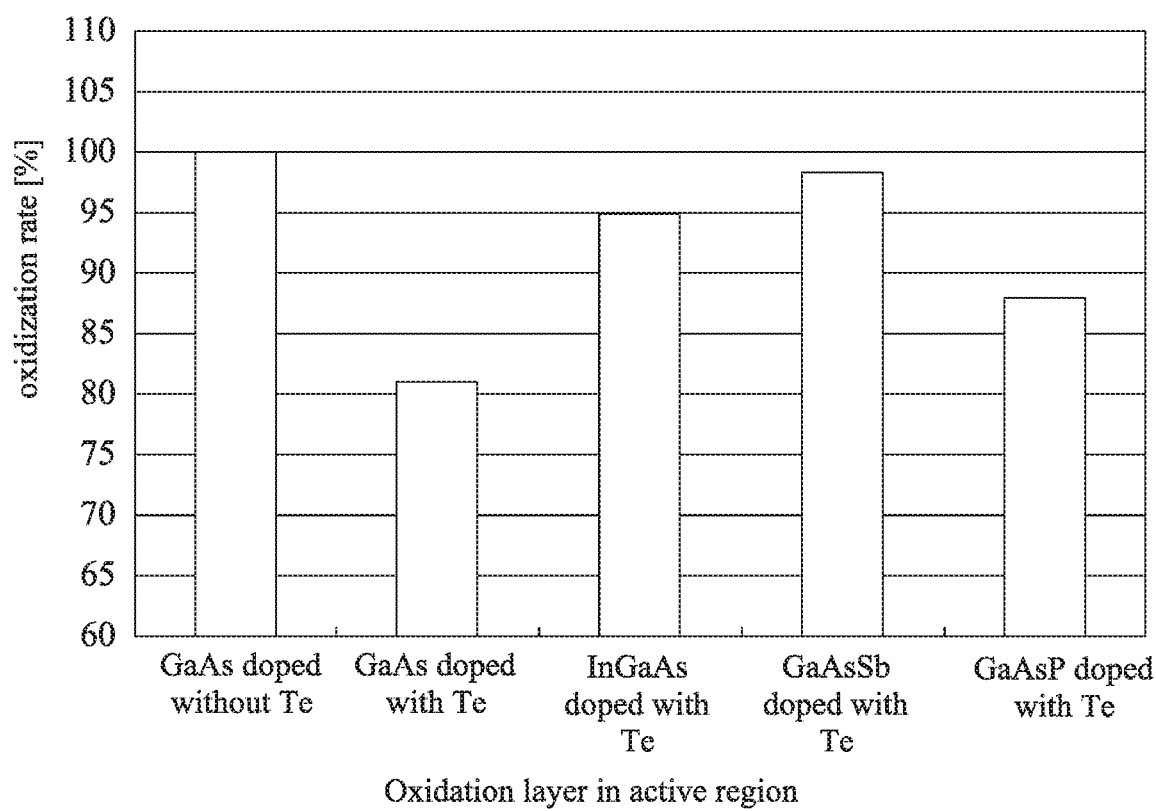
FIG. 11 is a schematic diagram of the oxidation rate of the oxidation layer in the active region when the n-type semiconductor layer and the n-type GaAs layer are formed between two active layers of the VCSEL according to three embodiments of the first n-type semiconductor layer.

Referring to FIG. 11, the five oxidation rates shown in FIG. 11 correspond to five VCSELs, respectively. The main structures of these five VCSELs are the same as the structure of the VCSEL of FIG. 7. For the three VCSELs thereof, the first tunnel junction is provided in the active region, while the existing tunnel junction is provided in the active region for the other VCSEL. In addition, the VCSEL having "GaAs doped without Te" in the active region is used as a control group. In the five VCSELs, the material of the oxidation layer in the active region and the upper epitaxial region is AlGaAs, and the content of aluminum is about 98%. The material of the (first) p-type semiconductor layer in the (first) tunnel junction is GaAs with a carbon doping concentration of $1.0 \times 10^{20}/cm^3$.

The VCSEL used as a control group has a "GaAs layer doped without Te" between the p-type semiconductor layer 601 and the active layer 33. The existing n-type semiconductor layer of the tunnel junction is a GaAs layer doped with Te. The three first n-type semiconductor layers are a InGaAs layer doped with Te, a GaAsSb layer doped with Te and a GaAsP layer doped with Te, respectively. The abovementioned Te doping concentration is $2.5 \times 10^{19}/cm^3$.

It is worth explaining again that the three first n-type semiconductor layers have stress relative to the GaAs substrate, but the existing n-type semiconductor layer in the tunnel junction does not have stress relative to the GaAs substrate.

Referring to FIG. 11, FIG. 11 shows the oxidation rates of the oxidation layers in the active regions of the five VCSELs after the five VCSELs are subjected to the oxidation process under the same oxidation process conditions. As shown in FIG. 11, the control-group VCSEL has the fastest oxidation rate of the oxidation layer. In FIG. 11, the oxidation rate of the "GaAs layer doped without Te" is set to 100%, and is used as a benchmark for comparison with the oxidation rates of the other four VCSELs.

However, when the existing n-type semiconductor layer of the tunnel junction is the "GaAs layer doped with Te" (not having stress relative to the GaAs substrate), the oxidation rate of the oxidation layer 36 in the active region is significantly reduced. If the doping concentration of Te becomes higher, the oxidation rate of the oxidation layer may be further decreased.

Compared to the "Te-doped GaAs layer" not having stress (relative to the GaAs substrate), all the three first n-type semiconductor layers having stress (relative to the GaAs substrate) increase the oxidation rates of the oxidation layers to a certain extent. In particular, the oxidation rate of the GaAsSb layer doped with Te is very close to the oxidation rate of the GaAs layer doped without Te.

Figure 12:
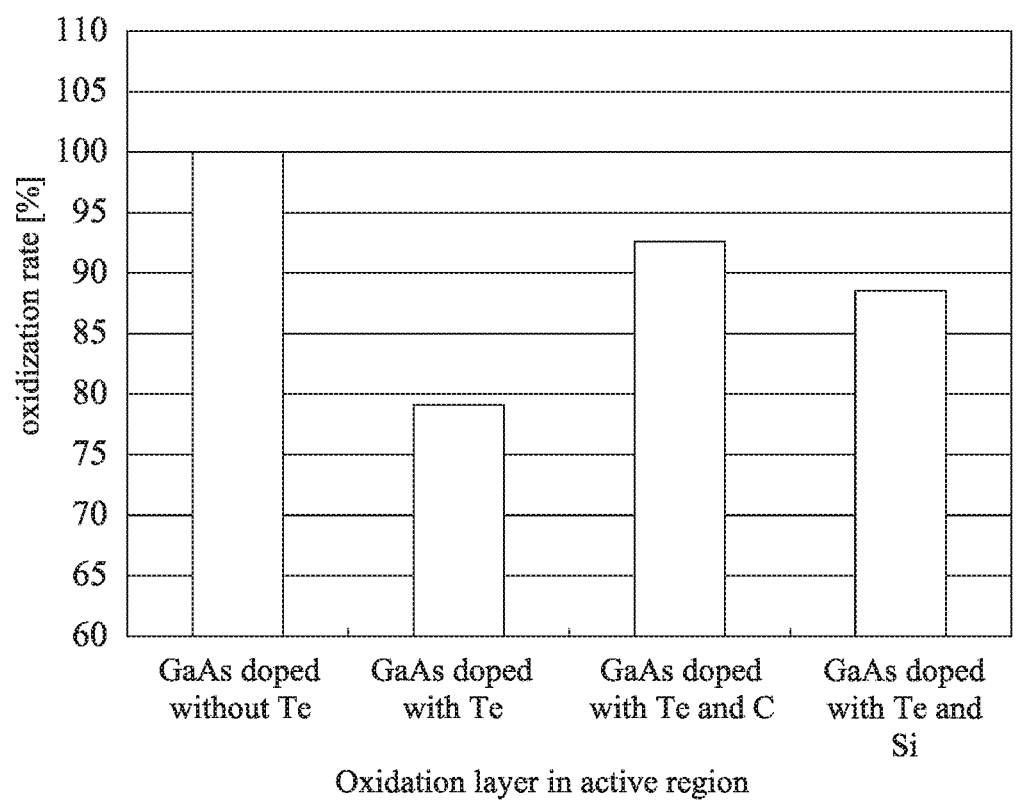
FIG. 12 is a schematic diagram of the oxidation rate of the oxidation layer in the active region when the n-type semiconductor layer and the n-type GaAs layer are formed between two active layers of the VCSEL according to two embodiments of the second n-type semiconductor layer.

Referring to FIG. 12, the four oxidation rates shown in FIG. 12 correspond to four VCSELs. The main structures of the four VCSELs are the same as the structure of the VCSEL of FIG. 7. For the two VCSELs thereof, the second tunnel junction is provided in the active region, while the existing tunnel junction is provided in the active region for the other VCSEL. In addition, the VCSEL having "GaAs doped without Te" in the active region is used as a control group. In the four VCSELs, the material of the oxidation layer in the active region and the upper epitaxial region is AlGaAs, and the content of aluminum is about 98%. The material of the (second) p-type semiconductor layer in the (second) tunnel junction is GaAs with a carbon doping concentration of $8 \times 10^{19}/cm^3$.

The VCSEL used as a control group has a "GaAs layer doped without Te" between the p-type semiconductor layer 601 and the active layer 33. The existing n-type semiconductor of the tunnel junction is a GaAs layer doped with Te. The two second n-type semiconductor layers are a GaAs layer doped with Te and C as well as a GaAs layer doped with Te and Si, respectively. The aforementioned Te doping concentration is $2.5 \times 10^{19}/cm^3$, the carbon doping concentration is $3 \times 10^{18}/cm^3$, and the silicon doping concentration is $2 \times 10^{18}/cm^3$.

Referring to FIG. 12, FIG. 12 shows the oxidation rates of the oxidation layers in the active regions of the four VCSELs after the four VCSELs are subjected to the oxidation process under the same oxidation process conditions. As shown in FIG. 12, the control-group VCSEL has the fastest oxidation rate of the oxidation layer. In FIG. 12, the oxidation rate of the "GaAs layer doped without Te" is set to 100%, and is used as a benchmark for comparison with the oxidation rates of the other three VCSELs.

The n-type second semiconductor layers doped with the above two elements are different from the existing n-type semiconductor layer. The n-type second semiconductor layers doped with the aforesaid two doping elements are able to increase the oxidation rates of the oxidation layers to a certain extent (no need to have stress relative to the GaAs substrate).

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A vertical cavity surface emitting laser diode (VCSEL), comprising:
   a GaAs substrate; and
   an epitaxial structure positioned on the GaAs substrate, wherein the epitaxial structure comprises:
   an oxidation layer; and a tunnel junction comprising a n-type semiconductor layer and being positioned above or below the oxidation layer, wherein the n-type semiconductor layer including InGaAs is doped with tellurium and/or selenium, and the n-type semiconductor layer is not latticed-matched to the GaAs substrate such that the n-type semiconductor layer has stress relative to the GaAs substrate, wherein the tunnel junction further comprises a p-type semiconductor layer, the p-type semiconductor layer including AlGaAs is doped with carbon, and a carbon doping concentration of the p-type semiconductor layer is greater than $8\times10^{19}/cm^3$, wherein the epitaxial structure comprises an active region, the active region comprising a plurality of active layers, and the tunnel junction and the oxidation layer are provided between two adjacent active layers of the plurality of active layers so that the two adjacent active layers are connected in series through the tunnel junction, wherein the oxidation layer comprises an optical aperture, the optical aperture is formed after the epitaxial structure is subject to an oxidation process.

2. The VCSEL as claimed in claim 1, wherein the n-type semiconductor layer is further doped with silicon and carbon.

3. The VCSEL as claimed in claim 1, wherein the epitaxial structure further includes an upper DBR layer and a lower DBR layer.

4. The VCSEL as claimed in claim 1, wherein the epitaxial structure comprises at least one spacer layer being positioned above or below the active region.

5. The VCSEL as claimed in claim 1, wherein the active region comprises at least one spacer layer, the at least one spacer layer is between two active layers of the plurality of active layers, and the tunnel junction is provided in the at least one spacer layer.

6. The VCSEL as claimed in claim 1, wherein the epitaxial structure further comprises another oxidation layer, and the another oxidation layer is provided outside the active region.

7. The VCSEL as claimed in claim 1, wherein the n-type semiconductor layer is further doped with silicon or carbon.

* * * * *